United States Patent
Dasgupta et al.

(10) Patent No.: US 6,566,961 B2
(45) Date of Patent: May 20, 2003

(54) WIDE-BAND SINGLE-ENDED TO DIFFERENTIAL CONVERTER IN CMOS TECHNOLOGY

(75) Inventors: Uday Dasgupta, Singapore (SG); Teo Tian Hwee, Singapore (SG)

(73) Assignees: Institute of Microelectronics, Singapore (SG); Oki Techno Centre (Singapore) Pte. Ltd., Singapore (SG)

(*) Notice: Subject to any disclaimer, the term of this patent is extended or adjusted under 35 U.S.C. 154(b) by 104 days.

(21) Appl. No.: 09/821,511

(22) Filed: Mar. 30, 2001

(65) Prior Publication Data

US 2002/0175763 A1 Nov. 28, 2002

(51) Int. Cl.[7] .................................................. H03F 3/04
(52) U.S. Cl. ......................... 330/301; 330/253; 330/257
(58) Field of Search ............................... 330/253, 257, 330/301

(56) References Cited

U.S. PATENT DOCUMENTS

| | | | |
|---|---|---|---|
| 3,932,768 A | * 1/1976 | Takahashi et al. | 327/323 |
| 4,292,597 A | * 9/1981 | Niimura et al. | 330/254 |
| 4,369,411 A | 1/1983 | Niimura et al. | 330/257 |
| 5,068,621 A | * 11/1991 | Hayward et al. | 330/253 |
| 5,220,286 A | 6/1993 | Nadeem | 330/9 |
| 5,404,050 A | * 4/1995 | Nauta | 327/100 |
| 5,614,864 A | 3/1997 | Stubbe et al. | 330/69 |
| 5,805,019 A | 9/1998 | Shin | 330/9 |
| 5,896,053 A | 4/1999 | Prentice | 327/255 |
| 6,285,259 B1 | * 9/2001 | Franck et al. | 330/301 |

FOREIGN PATENT DOCUMENTS

| EP | 0472340 A1 | 2/1992 | H03F/1/32 |
|---|---|---|---|
| EP | 07663381 A1 | 4/1997 | H03F/3/45 |

OTHER PUBLICATIONS

A. Grebene, "Bipolar and MOS Analog Integrated Circuit Design," John Wiley and Sons, 1991, pp. 415–416.

* cited by examiner

Primary Examiner—Michael Tokar
Assistant Examiner—Nguyen Khai
(74) Attorney, Agent, or Firm—George O. Saile; Stephen B. Ackerman

(57) ABSTRACT

A wide-band single-ended to differential converter (DC to 1 GHz) with very low amplitude and phase matching errors, of the order of 0.01 dB and 0.15 degrees respectively and using CMOS technology, is comprised of a first and a second stage. The very low amplitude and phase matching errors have been achieved firstly by the use of capacitive means $C_D$ across the gate and source of the first stage MOS transistor $M_1$ with a value equal to the drain to ground (reference potential) parasitic capacitance of the tail current source device for the first stage, and secondly by using equal valued capacitive means $C_{F1}$, $C_{F2}$ in the second stage and setting their values to be several (5–10) times more than the gate-drain parasitic capacitances of either of the differential transistors of the second stage.

19 Claims, 11 Drawing Sheets

FIG. 1 – Prior Art

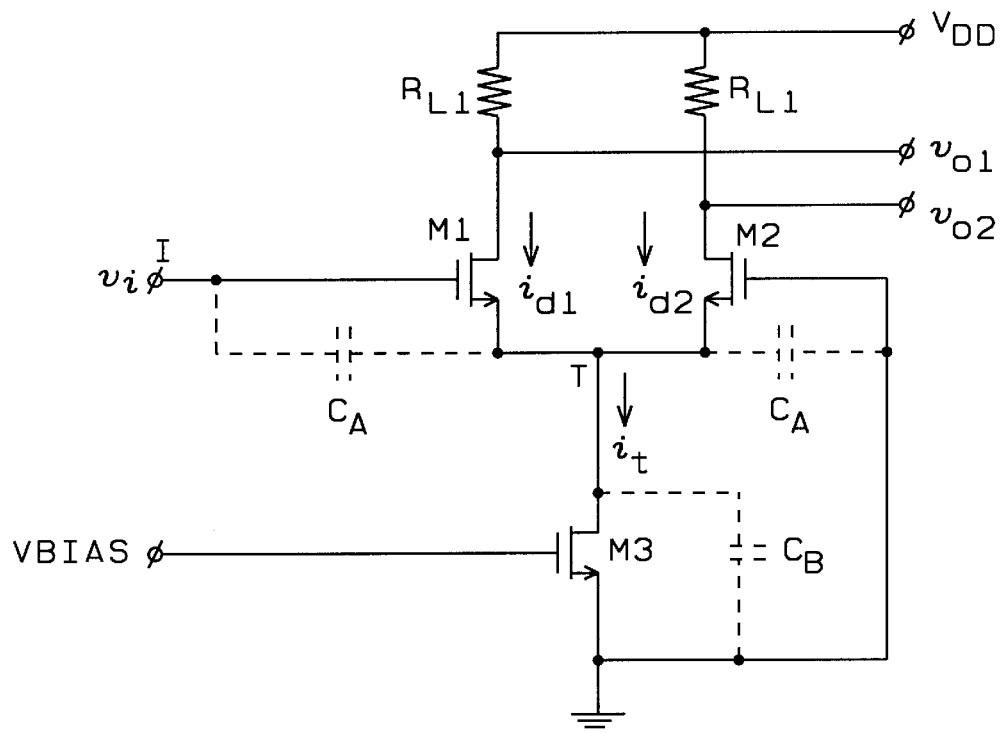
FIG. 3 – Prior Art
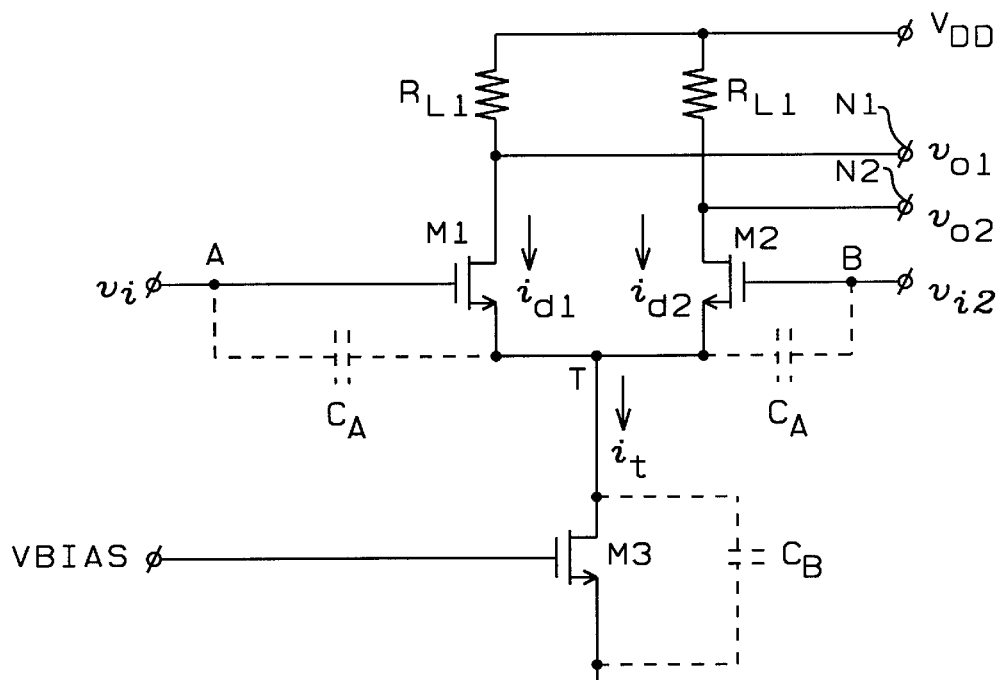
FIG. 4

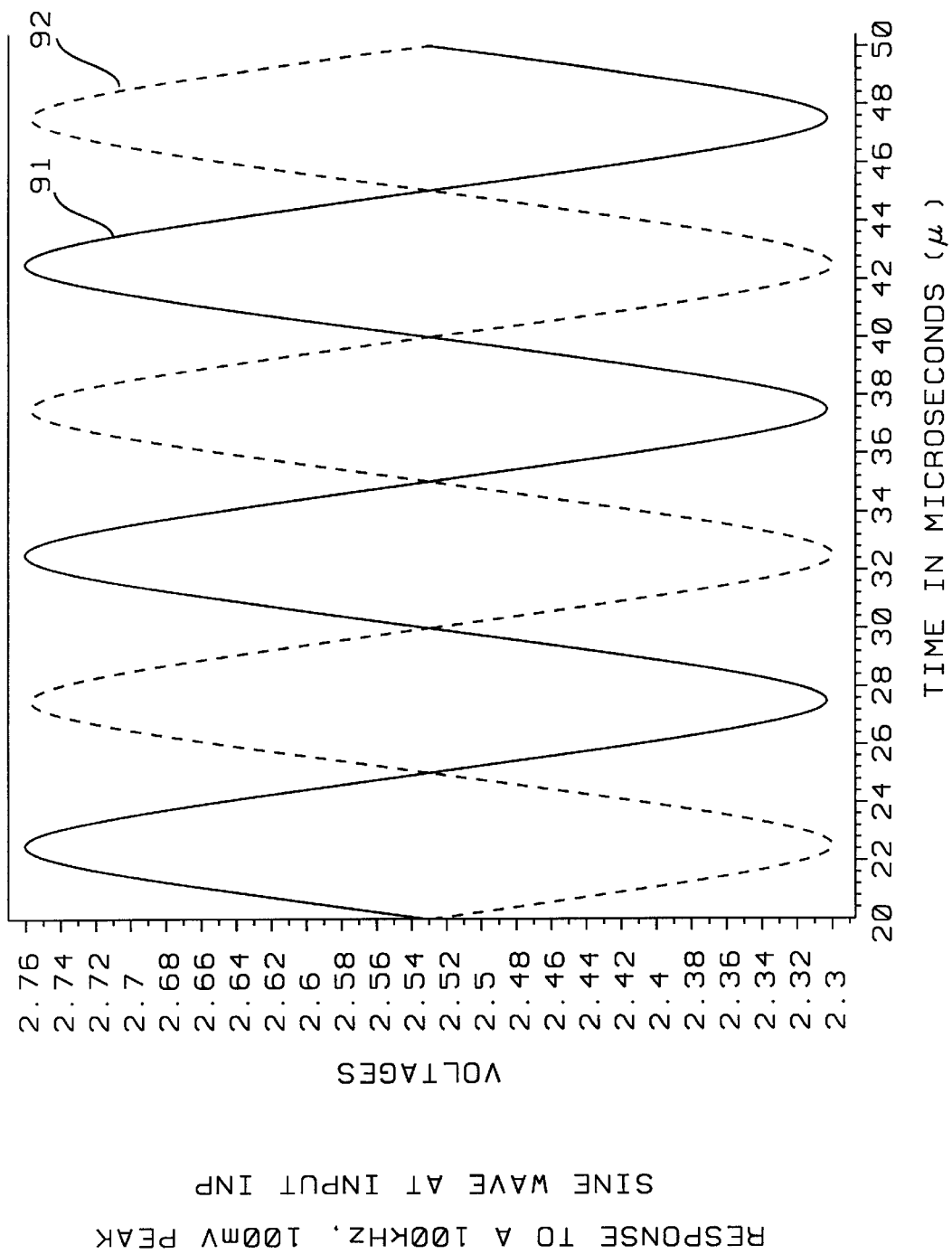

US 6,566,961 B2

1

WIDE-BAND SINGLE-ENDED TO DIFFERENTIAL CONVERTER IN CMOS TECHNOLOGY

BACKGROUND OF THE INVENTION

1. Field of the Invention

The invention relates to single-ended to differential converters, and more particularly to wide-band single-ended to differential converters (DC to 1 GHz) with very low amplitude and phase matching errors, of the order of 0.01 dB and 0.15 degrees respectively, using CMOS technology.

2. Description of the Related Art

FIG. 1 shows the prior art of a single to differential circuit which is directly derived from its bipolar counterpart, while FIG. 3 is the small signal version of FIG. 1. However, it is observed (and will be shown later) that the performance of this circuit cannot meet the requirement for a wide-band single-ended to differential converter (DC to 1 GHz) with very low amplitude and phase matching errors, of the order of 0.01 dB and 0.15 degrees respectively, using CMOS technology, especially at high frequencies. FIG. 1 is a differential amplifier comprised of transistors $M_1$ and $M_2$, their sources are coupled to a reference potential via a tail current source transistor $M_3$. Their drains are coupled each to a voltage supply $V_{DD}$ via resistive means $R_{L1}$. The gate of $M_1$ is connected to input INP via capacitive means $C_{I1}$. Input VBIAS1 provides bias to the gates of $M_1$ and $M_2$ via resistive means $R_{B1}$ and $R_{B2}$, respectively. The gate of $M_2$ is also connected to a reference potential via capacitive means $C_{I2}$. VBIAS2 provides bias to the gate of $M_3$. Outputs OUTA and OUTB are coupled to the drains of $M_1$ and $M_2$, respectively. FIG. 3, which shows parasitic gate-source capacitances $C_A$ and parasitic tail current capacitance $C_B$ will be discussed in detail in the Description of the Preferred Embodiment, because it directly bears on the design of the present invention.

Another prior art of a differential amplifier with capacitors for cancellation of the negative feedback action of the gate to drain parasitic capacitance $C_{GD}$ at high frequencies is explained in Alan B. Grebene, "*Bipolar and MOS Analog Integrated Circuit Design*", John Wiley and Sons, 1991, pp 415–416. This second prior art, however, does nothing to improve the amplitude and phase imbalances that we are concerned with.

The following US Patents relate to single-ended to differential converters:

1. U.S. Pat. No. 4,292,597 (Nimura et al.) Circuit for Converting Single-Ended Input Signals to a Pair of Differential Output Signals.
2. U.S. Pat. No. 4,369,411 (Nimura et al.) Circuit for Converting Single-Ended Input Signals to a Pair of Differential Output Signals.
3. U.S. Pat. No. 5,068,621 (Hayward et al.) Compensation Method and Apparatus for Enhancing Single Ended to Differential Conversion.
4. U.S. Pat. No. 5,220,286 (Nadeem) Single Ended to Fully Differential Converters, describes single-ended to differential converters using switched capacitor circuits. It is well known that the highest frequencies that can be handled by such circuits are in the range of a few hundreds of Kilohertz only.
5. U.S. Pat. No. 5,614,864 (Stubbe et al.) Single-Ended to Differential Converter with Relaxed Common-Mode Input Requirements.
6. U.S. Pat. No. 5,805,019 (Shin) Voltage Gain Amplifier for Converting a Single Input to a Differential Output, discloses single-ended to differential converters using switched capacitor circuits. It is well known that the highest frequencies that can be handled by such circuits are in the range of a few hundreds of Kilohertz only.
7. U.S. Pat. No. 5,896,053 (Prentice) Single Ended to Differential Converter and 50% Duty Cycle Signal Generator and Method, describes a circuit that can operate up to 300 MHz. But the implementation is with bipolar devices and is quite different from the invention described.
8. EP 0766381 (Stubbe et al.) Improved Single-Ended to Differential Converter with Relaxed Common-Mode Input Requirements, similar to U.S. Pat. No. 5,614,864 (Stubbe et al.) above.
9. EP 0472340 (Hayward et al.) A Compensation Method and Apparatus for Enhancing Single Ended to Differential Conversion, similar to U.S. Pat. No. 5,068,621 (Hayward et al.) above.

SUMMARY OF THE INVENTION

It is an object of the present invention to provide circuits and a method for a wide-band single-ended to differential converter (DC to 1 GHz) with very low amplitude and phase matching errors, of the order of 0.01 dB and 0.15 degrees respectively, using CMOS technology.

These and many other objects have been achieved by the use of capacitive means $C_D$ across the gate and source of first stage MOS transistor $M_1$ with a value equal to the drain to ground (reference potential) parasitic capacitance of the tail current source device for the first stage. Using equal valued capacitive means $C_{F1}$, $C_{F2}$ in the second stage and setting their values to be several (5–10) times more than the gate-drain parasitic capacitances of either of the differential transistors of the second stage.

These and many other objects and advantages of the present invention will be readily apparent to one skilled in the art to which the invention pertains from a perusal of the claims, the appended drawings, and the following detailed description of the preferred embodiments.

In the following, first and second conductivity types are opposite conductivity types, such as N and P types. Each embodiment includes its complement as well.

BRIEF DESCRIPTION OF THE DRAWINGS

FIG. 3 is the small signal circuit diagram of the amplifier of FIG. 1.

FIG. 4 is the small signal circuit diagram of a general differential amplifier stage.

FIG. 9 is a graph of the response to a 100 kHz 100 mV peak sine wave at input INP of the circuit.

DESCRIPTION OF THE PREFERRED EMBODIMENT

Figure 1:
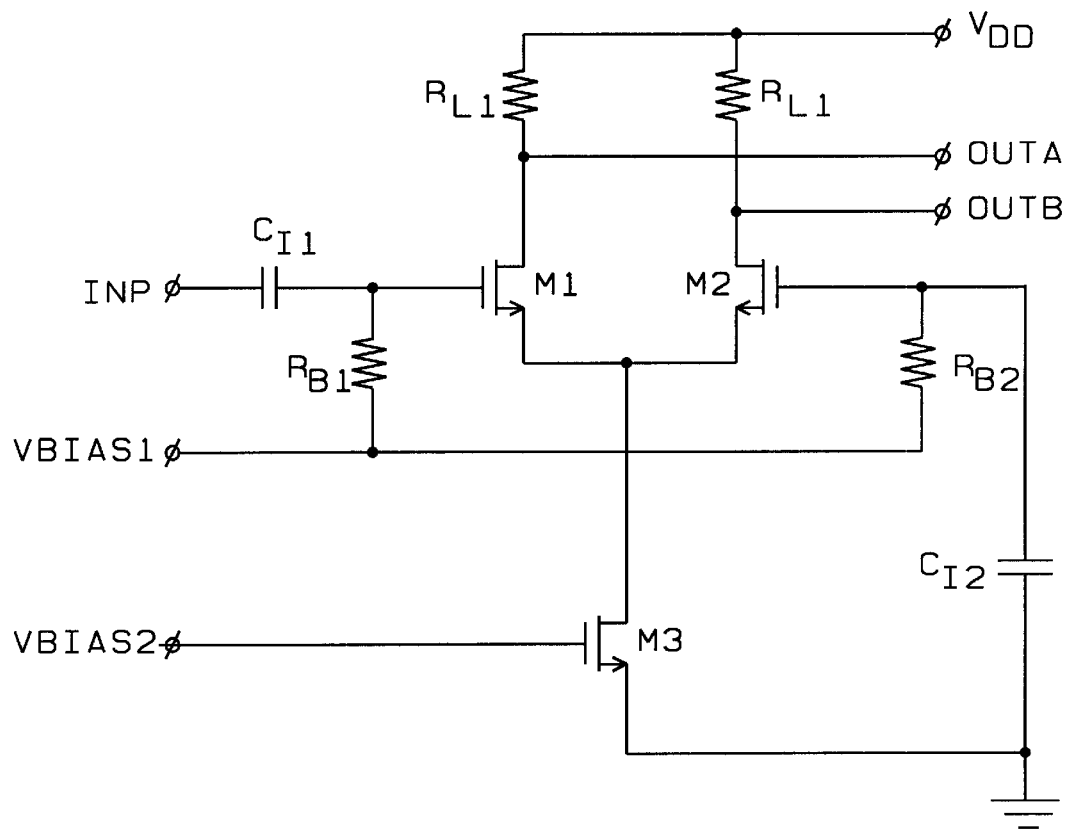
FIG. 1 is a circuit diagram of a single-ended to differential amplifier of the prior art.
Figure 2:
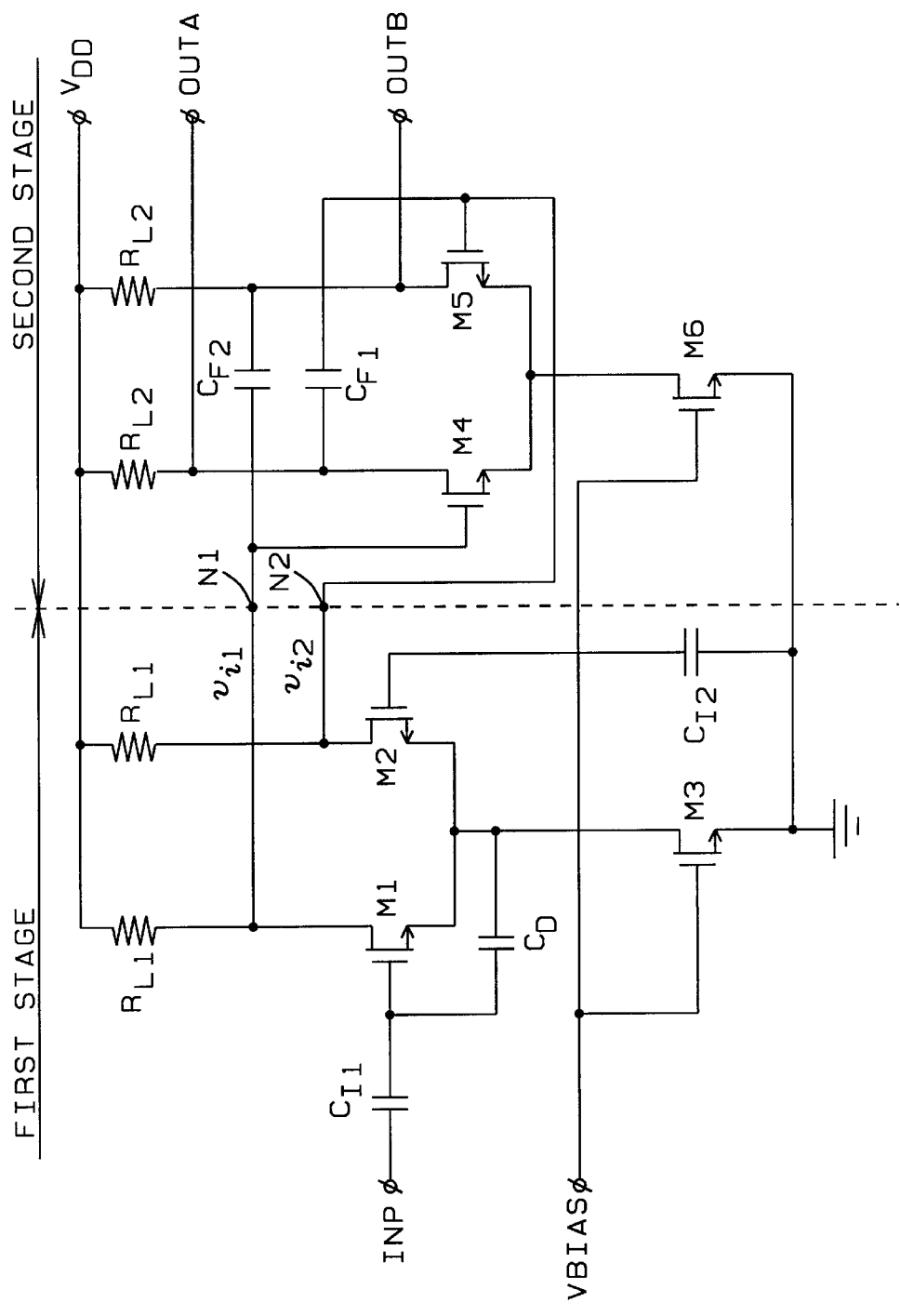
FIG. 2 is a simplified circuit diagram of a single-ended to differential converter of the present invention.

FIG. 2 depicts the basic idea of the present invention. It is a cascade of two amplifying stages (stage 1 and stage 2) joined by nodes N1 and N2. The first stage is a modified version of the prior art shown in FIG. 1 by addition of a capacitor $C_D$ between the source and gate of $M_1$. The biasing input VBIAS1 and biasing resistive means $R_{B1}$ and $R_{B2}$, of FIG. 1, are not shown for simplicity. The same or similar components in FIG. 2 and FIG. 1 have the same designation. The biasing input for transistor $M_3$ is now labeled VBIAS. The second stage differential amplifier is comprised of transistors $M_4$ and $M_5$, and $M_6$ as the tail current source transistor, which is coupled between $M_4$ and $M_5$ and the reference potential. Resistive means $R_{L2}$ are the two load resistors for $M_3$ and $M_4$ and coupled to voltage supply $V_{DD}$. Coupled between drains and gates of M4 and M5 are compensating capacitors $C_{F1}$, $C_{F2}$ which are 5–10 times larger in value than the gate-source capacitance of $M_6$ and which extend the frequency range to 1 GHz. The second stage, although structurally identical to the second prior art reference of A. B. Grebene, is applied differently in the invention, as will be explained later.

FIG. 3 shows the small signal version of the prior art of FIG. 1, where the same components have the same label. This is also the first stage of the inventive circuit but without the capacitor $C_D$. We will first try to understand why the prior art does not perform well. After that we will describe our method to improve the performance. In this figure, we have only considered small-signal voltages and currents. $C_A$ is the parasitic gate source capacitor ($C_{GS}$) of any one of the differential pair transistors $M_1$, $M_2$. $C_B$ is the sum of the parasitic source to substrate ($C_{SB}$) capacitances of $M_1$ and $M_2$ and the parasitic drain to substrate ($C_{DB}$) of the tail current source transistor $M_3$. The substrates of all the transistors are connected to the reference potential. Therefore, $C_B$ is the total parasitic capacitance appearing between the drain of $M_3$ and the reference potential (ground). For output signals $v_{o1}$ and $v_{o2}$ to be of exactly equal amplitude and exactly opposite phase, we must have $i_{d1}$ and $i_{d2}$ to be equal and opposite. This can only happen provided the input voltage $v_i$ divides equally across the gate-sources of $M_1$ and $M_2$. This is, however, not readily achieved in the prior art of FIG. 1 because nearly half of $v_i$, at input I, appears at node T causing $i_t$ to flow through the output conductance of $M_3$. As a result, it is not possible to satisfy the desired relationship between $i_{d1}$ and $i_{d2}$ and because of that, the gate-source voltages of $M_1$ and $M_2$ are also not equal.

This situation can be corrected to a large extent by making $i_{d1}$, $i_{d2}$ much larger than $i_t$. This, in turn, will require the transconductance of $M_1$ or $M_2$ to be much larger than the output conductance of $M_3$. Large transconductances are not usually achieved with CMOS devices. In such cases, cascoding of $M_3$ will help. However, this arrangement works only at low frequencies. At high frequencies, parasitic capacitors $C_A$ and $C_B$ come into action. The total capacitance between the gate and source of $M_1$ is $C_A$, whereas the total capacitance between that of $M_2$ is $C_A+C_B$. Because of the unequal capacitances, the input voltage splits unequally across the gate-source of $M_1$ and $M_2$, and therefore, $i_{d1}$ and $i_{d2}$ are no longer what we want.

Now, if a capacitor $C_D$, with the same value as $C_B$, is connected across the gate and source of $M_1$ then the desired results can be achieved. This arrangement will split the input voltage equally across the gate-source of $M_1$ and $M_2$ at high frequencies. In addition to this, if we also follow the precautions discussed in the last paragraph, it is possible to have much superior performance compared to that of the prior art in FIG. 1 at all frequencies.

However, in practice—for example, due to a mismatch between $C_D$ and $C_B$—the output of the first stage in FIG. 2 may still have small amplitude and phase imbalances that need to be further improved. This can be done with a fully differential second stage following the first stage. To understand how a general fully differential stage corrects the small imbalances, please refer to FIG. 4. The layout of FIG. 4 is identical to that of FIG. 3, except that the gate of $M_2$ is not connect to the reference potential and that the inputs A and B to the gates of M1 and M2 apply signals $v_{i1}$ and $v_{i2}$, respectively. The same components of FIG. 3 and FIG. 4 are identified by the same label. Again, only small signal voltages and currents are considered. If the changes in $v_{i1}$ and $v_{i2}$ are equal and opposite, there is no voltage change at node T. The gate-source of $M_1$ and $M_2$ see changes that are exactly $v_{i1}$ and $v_{i2}$ respectively and therefore, $i_{d1}$ and $i_{d2}$ are equal and opposite. Now if there are small imbalances in the inputs, the voltage changes appearing at node T will also be small and the resulting magnitude of $i_t$ be negligible. This will result in very nearly equal and opposite $i_{d1}$ and $i_{d2}$. This improvement can be enhanced by making the transconductances of $M_1$ and $M_2$ much larger than the output conductance of $M_3$. For this purpose, cascoding of $M_3$ might be necessary. At high frequencies, parasitic capacitances $C_A$ and $C_B$ come into action. The voltage changes at node T are still small and, in fact, attenuated by a factor $(C_A+C_B)/(2C_A+C_B)$. The imbalances at the input will still improve at the output, although the amount will not be as great as in low frequency with cascoding.

Figure 5:
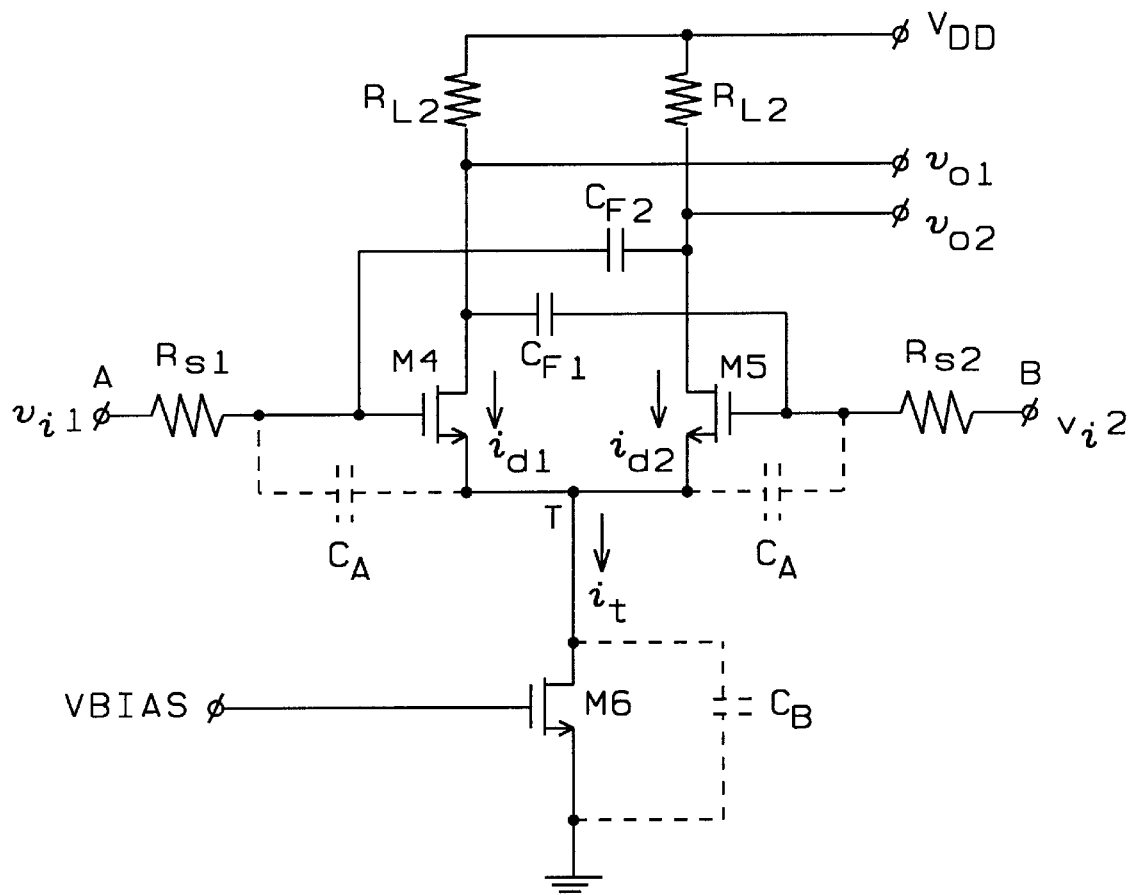
FIG. 5 is the small signal circuit diagram of the second stage of the converter of FIG. 2

Now we will explain in FIG. 5 how the capacitors $C_{F1}$, $C_{F2}$ used in the second stage help to improve the performance still further. FIG. 5 is the small signal equivalent of the second stage of the inventive circuit in FIG. 2. The resistors $R_{S1}$, $R_{S2}$ are the output resistances of the first stage. Let us assume the inputs $v_{i1}$ and $v_{i2}$ to have small imbalances in amplitude and phase. The differential stage, as per discussions in the last paragraph improves on the imbalances and the capacitors $C_{F1}$, $C_{F2}$ feed the corrected output back to the appropriate inputs such that they add almost in phase with the inputs with the help of the resistors $R_{S1}$, $R_{S2}$. As a result of this addition, the input imbalances also improve and the output gets further corrected at high frequencies. This process continues till an equilibrium is reached with the output imbalances considerably improved, especially at high frequencies. It can be noted that $C_{F1}$, $C_{F2}$ provide a positive feedback and therefore also help to extend the high frequency response of the overall circuit. The second prior art reference of A. B. Grebene requires that each of these capacitors will have to be equal to the gate-drain parasitic capacitance $C_{GD}$ of $M_1$ or $M_2$. However, in this invention, the value of $C_F$ is chosen to be 5–10 times larger than $C_{GD}$ to overcome the latter's negative feedback effects.

Figure 6:
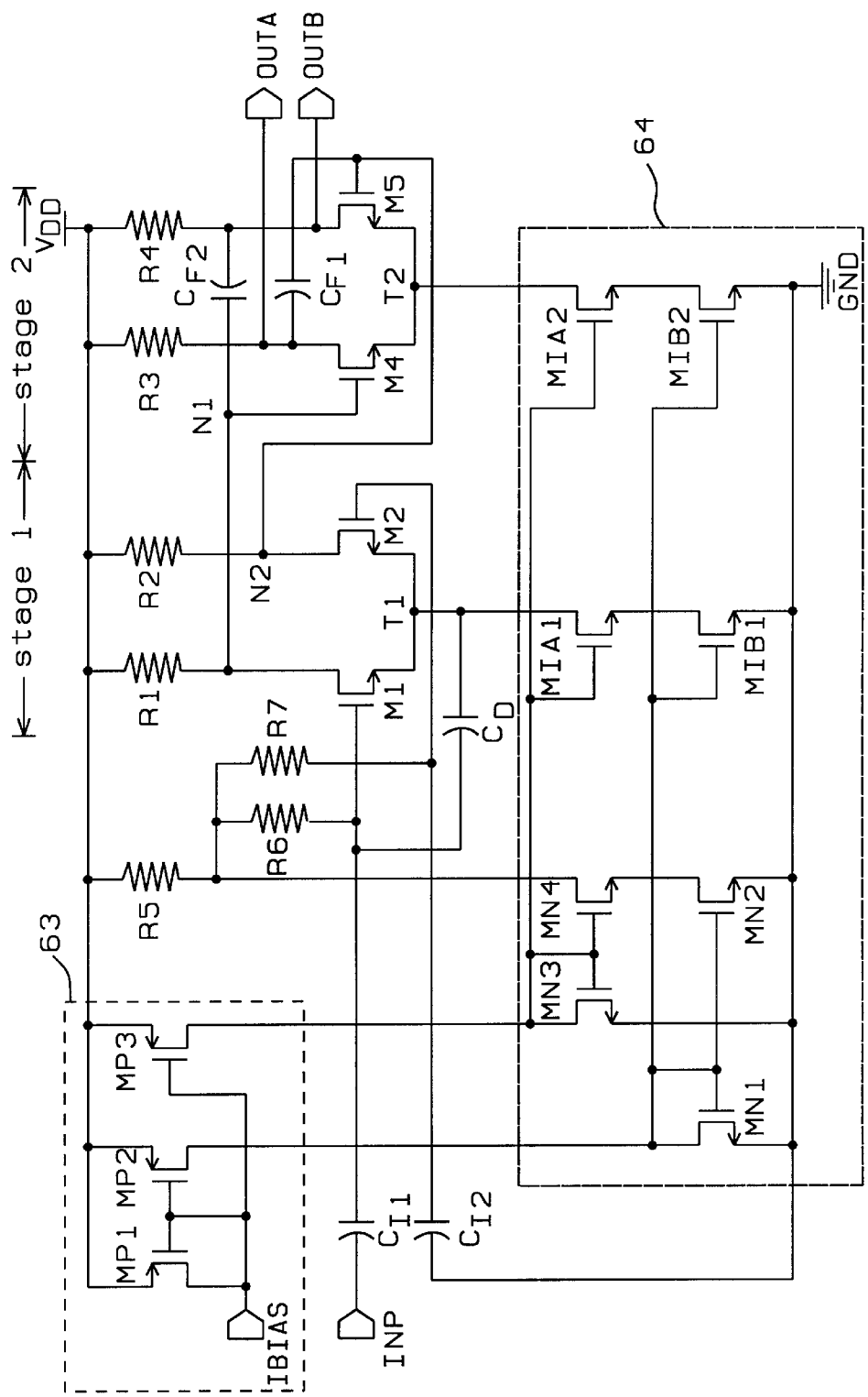
FIG. 6 is a complete circuit diagram of the circuit of FIG. 2.

The actual implementation of the invention is shown in FIG. 6. It includes the biasing circuitry 63 and cascode current sources 64 for both the first stage 61 and the second stage 62. The entire circuit is biased by a single current source from the node 'IBIAS' to ground. Biasing circuit 63 is comprised of a current source transistor MP1 and two current mirror transistors MP2 and MP3. MP2 and MP3 feed current source transistors MN1 and MN3 of cascode current sources 64. Cascode current sources 64 are further comprised of a first current mirror consisting of MIA1, MIB1, a second current mirror consisting of MIA2, MIB2, and a third current mirror consisting of MN2, MN4. The first and second current mirrors are the tail current sources for the first and second stage, respectively. The third current mirror is the current source for resistive means R5.

Still referring to FIG. 6, the first stage is comprised of MOS transistors $M_1$ and $M_2$, their sources joined at node T1, their drains coupled via resistive means $R_1$ and $R_2$, each of value $R_{L1}$, to voltage supply $V_{DD}$. The gate of transistor $M_1$ is coupled to input INP via capacitive means $C_{I1}$. The gate of transistor $M_2$ is coupled to the reference potential via capacitive means $C_{I2}$. In addition both gates are coupled to resistive means $R_5$ via resistive means $R_6$ and $R_7$.

The second stage 62, coupled through nodes N1 and N2 to the first stage 61, is comprised of MOS transistors $M_4$ and $M_5$. Their sources are joined at node T2, and their drains are coupled via resistive means $R_3$ and $R_4$, each of value $R_{L2}$, to voltage supply $V_{DD}$. The gates of transistors $M_4$ and $M_5$ are coupled to the drains of $M_1$ and $M_2$, respectively. Feedback capacitor $C_{F1}$ is connected from the drain of $M_4$ to the gate of $M_5$, and feedback capacitor $C_{F2}$ is connected from the drain of $M_5$ to the gate of $M_4$. These feedback capacitors, each of value $C_F$, significantly extend the high frequency response of the circuit as previously stated and illustrated in Table 4. The second stage outputs OUTA and OUTB are coupled to the drains of transistors $M_4$ and $M_5$, respectively.

Simulation Results

Table 1 below summarizes the simulation results using Hspice and a standard 0.35 μm (1 μm=$10^{-6}$ m) CMOS triple poly, quad metal process. The simulation results show very low amplitude and phase matching errors of 0.01 dB and 0.14 degrees at 1 GHz (1 GHz=$10^9$ Hertz) in Table 4. At 100 KHz the results are even better. The simulation results are also presented with and without $C_D$ and $C_F$ to show the effect of the capacitors in Tables 1, 2, and 3. Simulation plots are shown in FIGS. 7 to 10. The circuit can work at lower frequencies than 100 KHz—theoretically DC—provided the coupling capacitors $C_{I1}$ and $C_{I2}$, usually equal in value, are appropriately increased.

TABLE 1

With first stage only with $C_D$ removed.

| Frequency | Mag.of gain at OUTA (dB) | Mag.of gain at OUTB (dB) | Phase of gain at OUTA (deg.) | Phase of gain at OUTB (deg.) | Mag. Error (dB) | Phase Error (deg.) |
|---|---|---|---|---|---|---|
| 100 KHz | 0.8941572 | 0.8410165 | −179.9104 | 0.085256 | 0.0531407 | 0.004344 |
| 1 GHz | 0.3518937 | −0.996855 | 162.4936 | −49.7408 | 1.3487491 | 32.2344 |

TABLE 2

With both stages with $C_D$, $C_{F1}$, $C_{F2}$ removed.

| Frequency | Mag.of gain at OUTA (dB) | Mag.of gain at OUTB (dB) | Phase of gain at OUTA (deg.) | Phase of gain at OUTB (deg.) | Mag. Error (dB) | Phase Error (deg.) |
|---|---|---|---|---|---|---|
| 100 KHz | 7.8617 | 7.8615 | 0.0836726 | −179.9157 | 0.0002 | 0.006 |
| 1 GHz | 4.5759 | 5.6983 | −60.9852 | 113.2932 | 1.1224 | 5.7216 |

TABLE 3

With both stages with $C_D$ removed.

| Frequency | Mag.of gain at OUTA (dB) | Mag.of gain at OUTB (dB) | Phase of gain at OUTA (deg.) | Phase of gain at OUTB (deg.) | Mag. Error (dB) | Phase Error (deg.) |
|---|---|---|---|---|---|---|
| 100 KHz | 7.8617 | 7.8615 | 0.0848406 | −179.9145 | 0.0002 | 0.0004594 |
| 1 GHz | 6.5798 | 6.6852 | −69.0413 | 107.8650 | 0.1054 | 3.0937 |

TABLE 4

With complete circuit.

| Frequency | Mag.of gain at OUTA (dB) | Mag.of gain at OUTB (dB) | Phase of gain at OUTA (deg.) | Phase of gain at OUTB (deg.) | Mag. Error (dB) | Phase Error (deg.) |
|---|---|---|---|---|---|---|
| 100 KHz | 7.8617 | 7.8615 | 0.0848338 | −179.9145 | 0.0002 | 0.0006662 |
| 1 GHz | 6.6359 | 6.6231 | −70.6712 | 109.4763 | 0.0128 | 0.1475 |

The improvement in frequency response with addition of $C_{F1}$, $C_{F2}$ is also to be noted.

Per Table 4 the following improvements are realized by the preferred embodiment of the present invention:
a) The magnitude of gain at outputs OUTA and OUTB is 7.86 dB (10 dB=1 Bell), but may be ranging from 7 to 9 dB at a frequency of 100 kHz (1 kHz=1000 Hertz).
b) The magnitude of gain at outputs OUTA and OUTB is 6.6 dB, but may be ranging from 6 to 8 dB at a frequency of 1 GHz (1 GHz=$10^9$ Hertz).
c) The phase of gain at output OUTA is 0.0848338 degrees, but is less than 0.09 degrees at a frequency of 100 kHz.
d) The phase of gain at output OUTA is −70.6712 degrees, but is less than −72 degrees at a frequency of 1 GHz.
e) The phase of gain at output OUTB is −179.9145 degrees, but is at least −179 degrees at a frequency of 100 kHz.
f) The phase of gain at output OUTB is 109.4763 degrees, but is at least 108 degrees at a frequency of 1 GHz.
g) The magnitude and phase error at the frequency of 1 GHz, when referenced to a signal at input INP, is 0.0128 dB and 0.1475 degrees, but will be no more than 0.015 dB and 0.15 degrees, respectively.

Figure 7A:
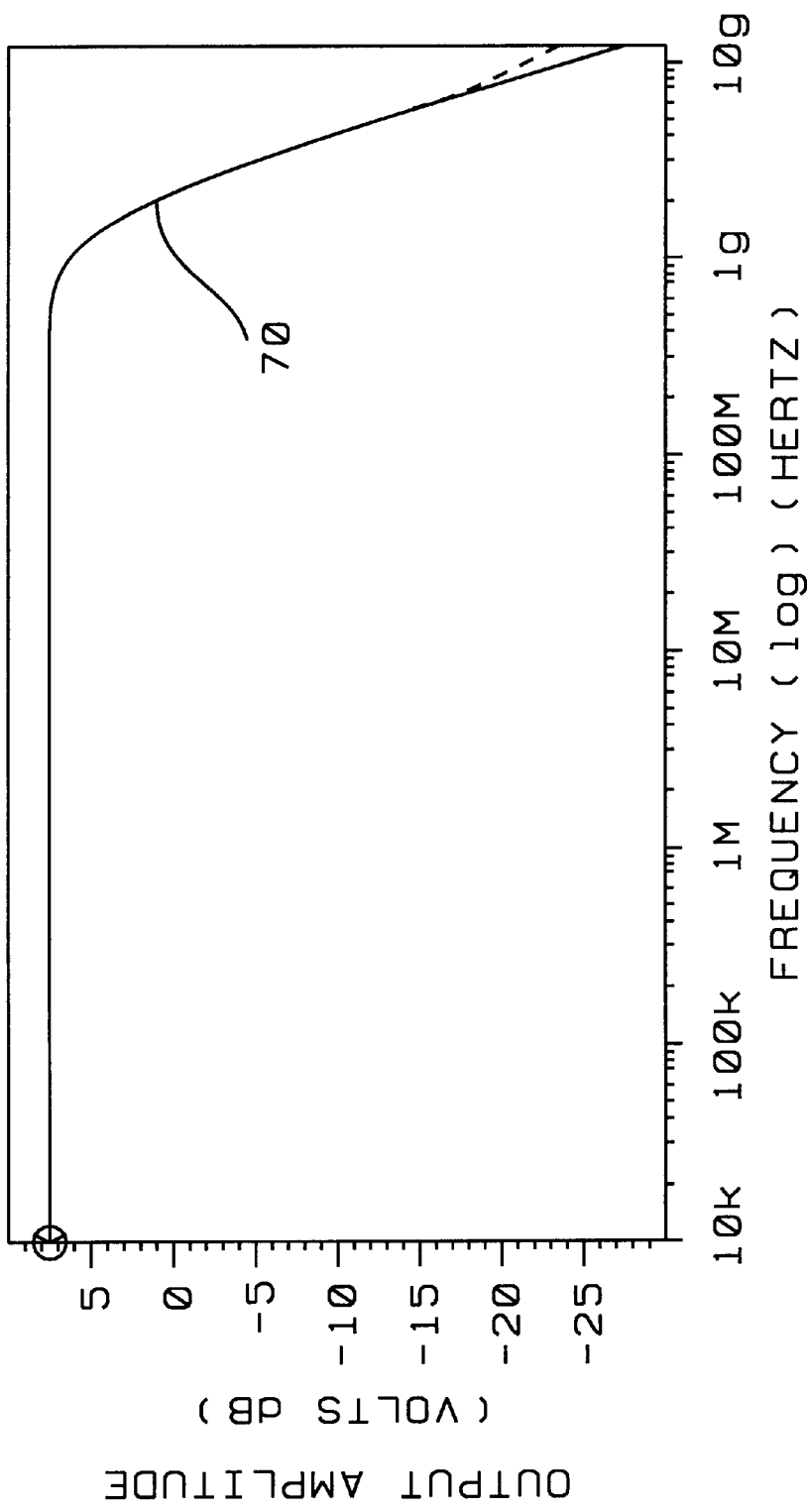
FIGS. 7a and 7b are graphs of the output amplitude and phase of the circuit as shown in FIG. 6.

FIG. 7a is a graph of the output amplitude in dB vs. frequency from 10 kHz to 10 GHz for both outputs OUTA and OUTB. Curve 70 describes both outputs up to well beyond 1 GHz.

Figure 7B:
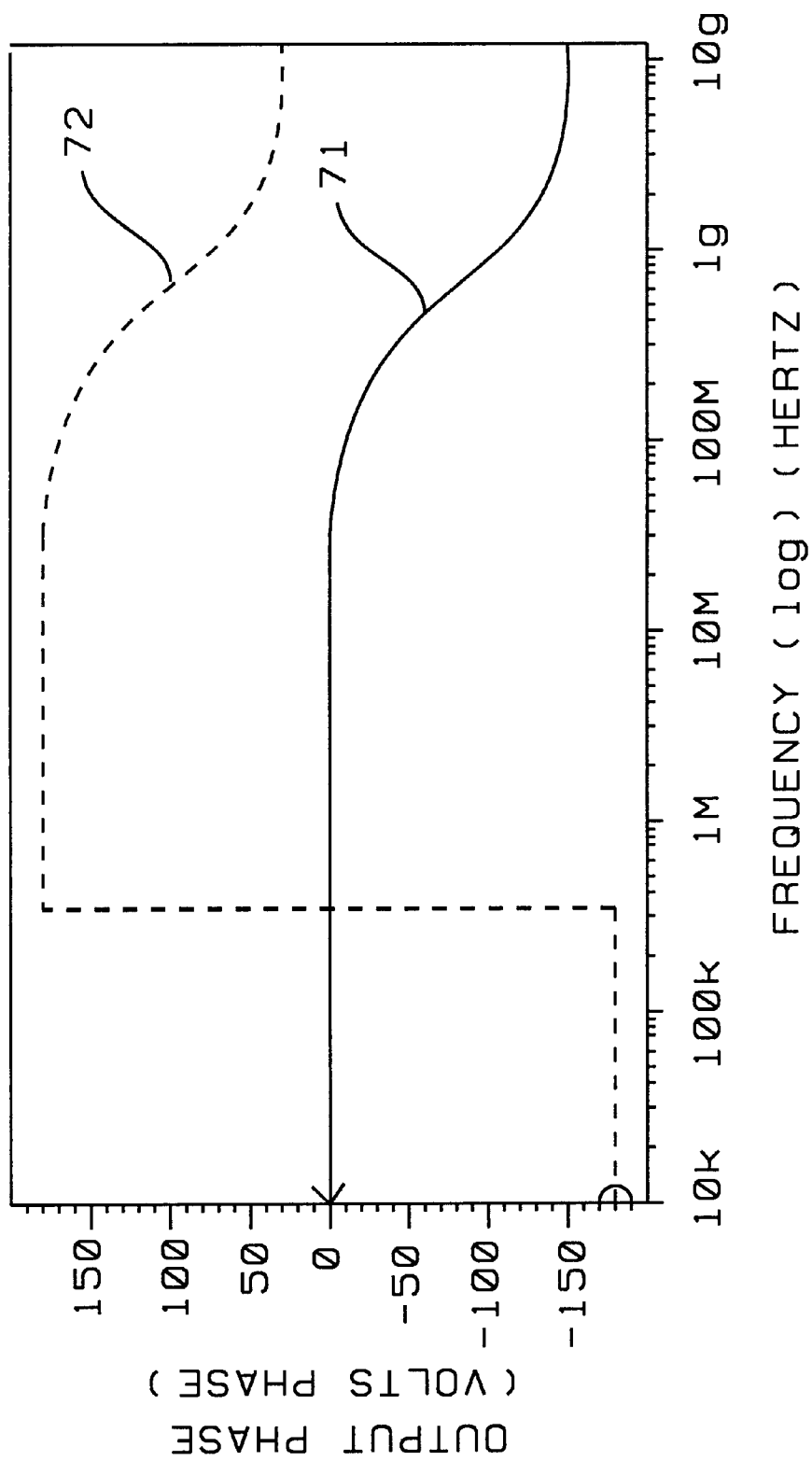

FIG. 7b is a graph of the output phase in degrees vs. frequency from 10 kHz to 10 GHz. Curve 71 indicates output OUTA and Curve 72 indicates output OUTB. OUTB is shown to switch from a negative 180 degrees phase to a positive 180 degrees phase at around 400 kHz. However, there is no phase switch because +180 degrees and −180 degrees are the same phase angle. The switch in the phase angle of Curve 72 is an artifact of the numerical techniques used by the simulator.

Figure 8A:
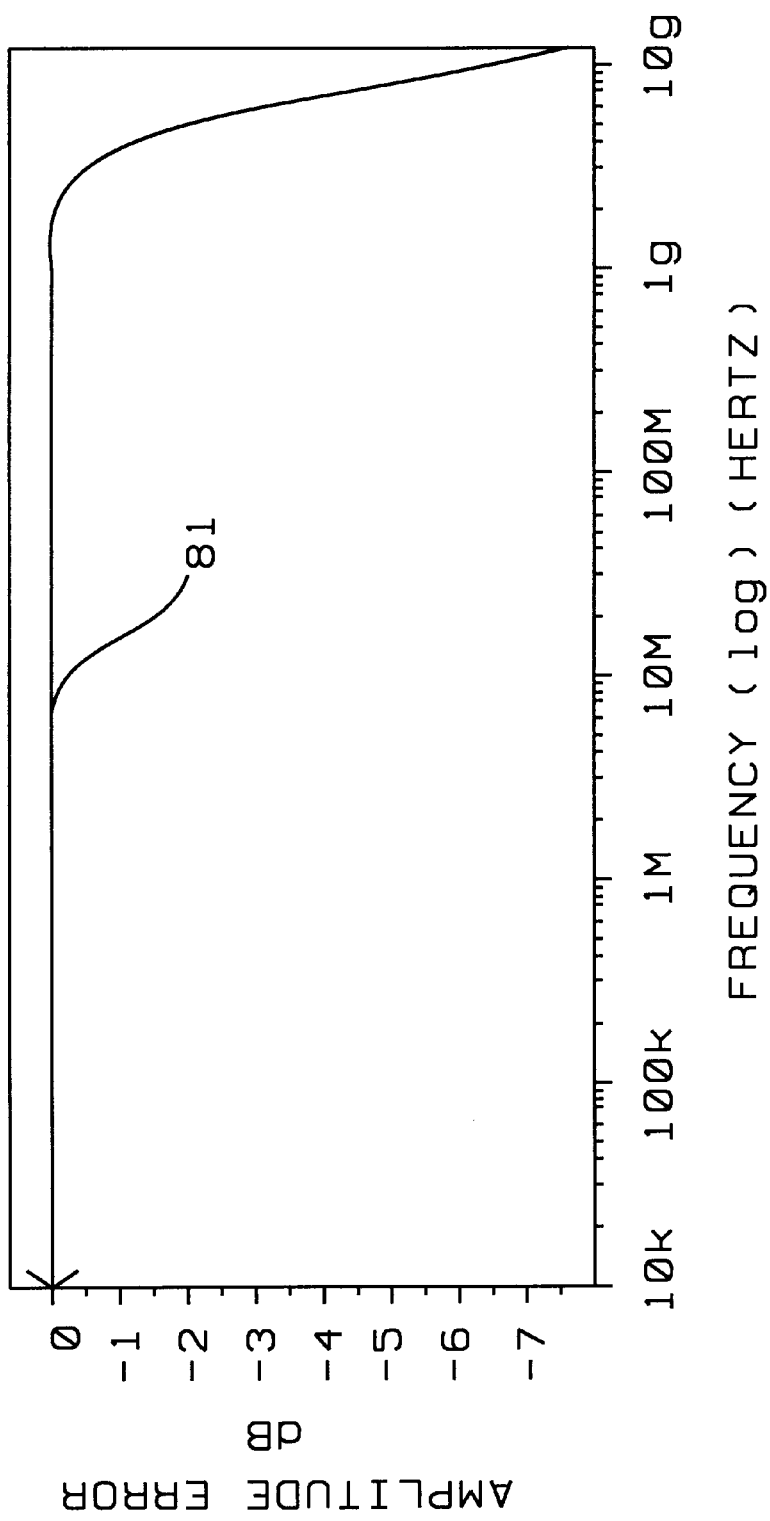
FIGS. 8a and 8b are graphs of the output amplitude and phase error of the circuit as shown in FIG. 6.

FIG. 8a is a graph of the output OUTA amplitude error in dB vs. frequency from 10 kHz to 10 GHz. Curve 81 indicates that the amplitude error is near zero and constant up to 1 GHz.

Figure 8B:
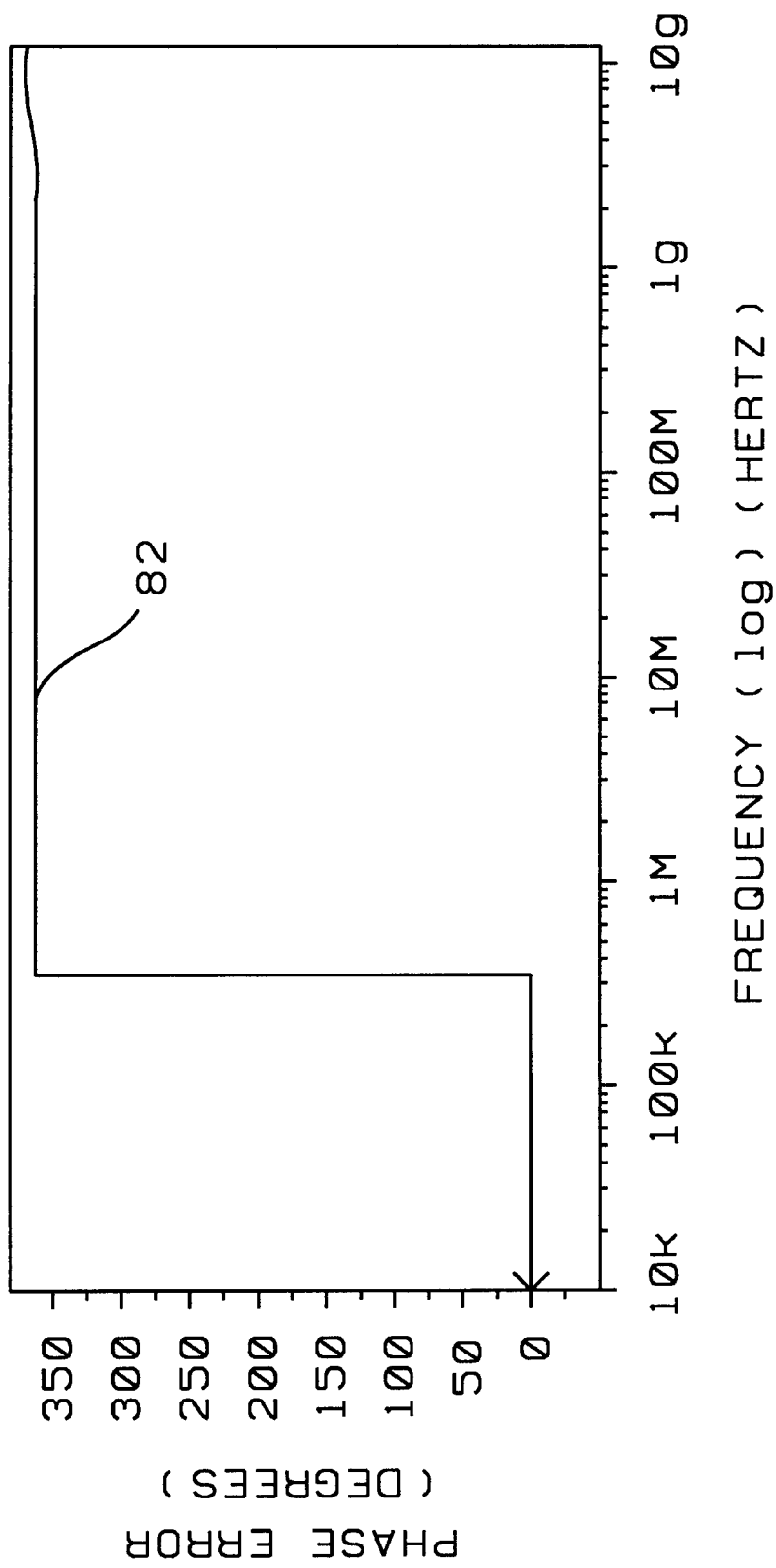

FIG. 8b is a graph of the output OUTA phase error in degrees vs. frequency from 10 kHz to 10 GHz. Curve 82 indicates a phase error of near zero up to about 400 kHz. Then the phase error is shown to switch to nearly 360 degrees and stays constant to past 1 GHz. However, there is no change in the phase error because 0 degrees and 360 degrees are the same phase angle. This is again an artifact of the numerical techniques used by the simulator.

FIG. 9 is a graph of the response at outputs OUTA and OUTB to a 100 kHz 100 mV peak sine wave at the input INP in volt vs. a period of time from 20 microseconds to 50 microseconds. Curve 91 indicates output OUTA and Curve 92 indicates output OUTB. A symmetrical swing of 230 mV around 2.53 V for both outputs is indicated when both curves are compared.

Figure 10:
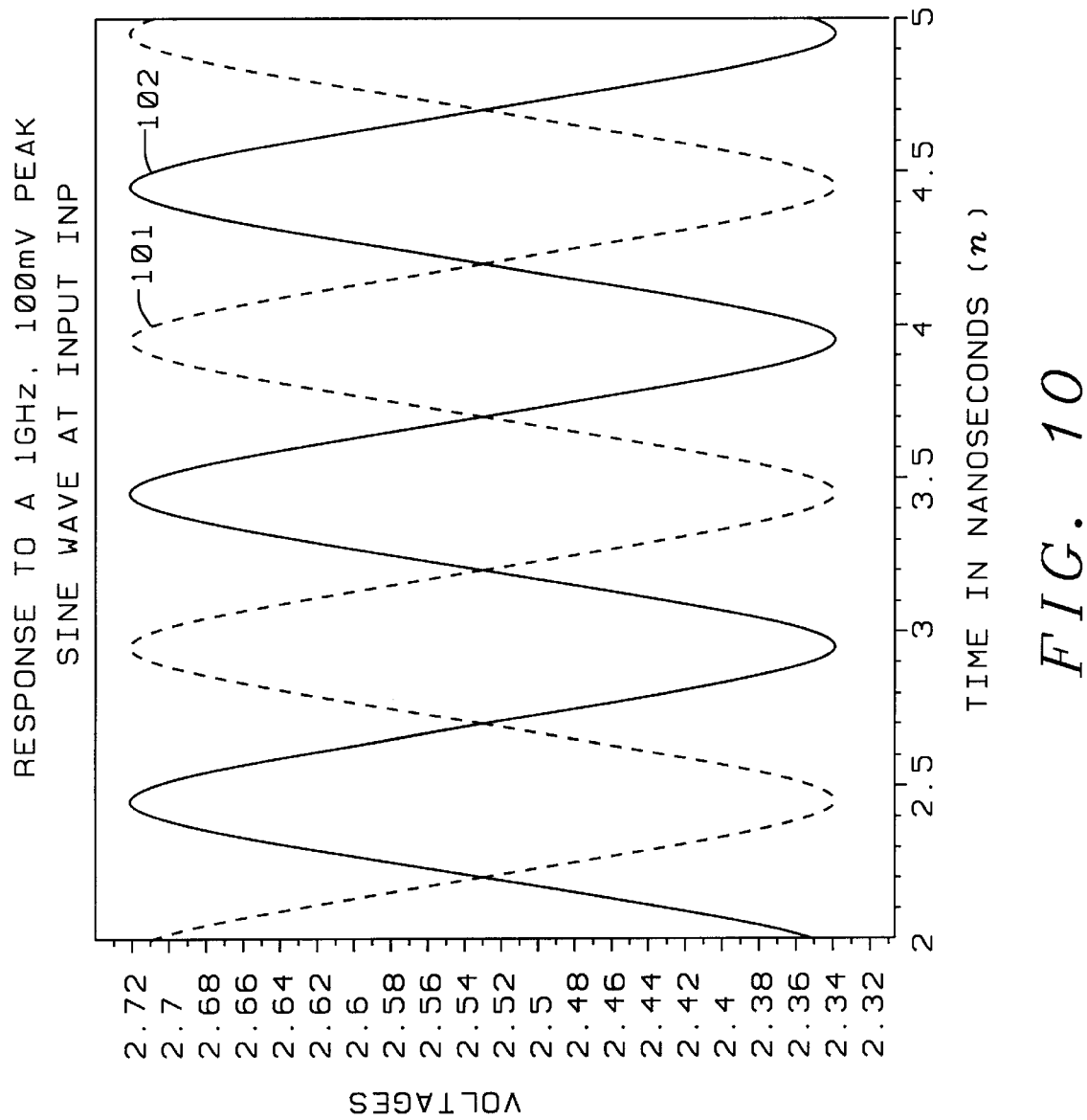
FIG. 10 is a graph of the response to a 1 GHz 100 mV peak sine wave at input INP of the circuit.

FIG. 10 is a graph of the response at outputs OUTA and OUTB to a 1 GHz 100 mV peak sine wave at the input INP in volt vs. a period of time from 2 nanoseconds to 5 nanoseconds. Curve 101 indicates output OUTA and Curve 102 indicates output OUTB. A symmetrical swing of 190 mV around 2.53 V for both outputs is indicated when both curves are compared Advantages The advantages over the prior art are quite obvious when the results in Table 1 are compared with those of Table 4 and FIGS. 7a, 7b, 8a, 8b, 9, and 10. In addition the very substantial advantages are gained by adding just three capacitor to the circuit.

While the invention has been particularly shown and described with reference to the preferred embodiments thereof, it will be understood by those skilled in the art that various changes in form and details may be made without departing from the spirit and scope of the invention.

What is claimed is:

1. A circuit for converting a single-ended input signal to a differential output signal, comprising:

a voltage supply;

a reference potential;

a first stage, having an input INP and a bias input IBIAS, first and second output nodes N1 and N2, said first stage providing a differential output signal at said nodes N1 and N2, said first stage having a first and a second MOS transistor of a first conductivity-type forming a differential amplifier, a first and a second resistive means connected between said voltage supply and the drain of said first and said second MOS transistor, respectively, where the drains of said first and said second MOS transistor represent said first and said second output node N1 and N2, respectively, the gate of said first MOS transistor connected to said input INP via capacitive means $C_I$, and where a capacitive means $C_D$ connected across said gate and a source of said first MOS transistor compensates for a parasitic drain to reference potential capacitance $C_B$ of a tail current source; and a second stage connected to said nodes N1 and N2, said second stage having a third and a fourth MOS transistor of said first conductivity-type forming a differential amplifier, where gates of said third and said fourth MOS transistors are connected to said nodes N1 and N2, respectively, where a third and a fourth resistive means are connected between said voltage supply and the drain of said third and said fourth MOS transistor, respectively, said second stage having outputs OUTA and OUTB coupled to the drains of said third and said fourth MOS transistor, respectively, said outputs OUTA and OUTB providing fully differential, wide-band signals ranging in frequency from 100 kHz to 1 GHz (1 GHz=$10^9$ Hertz), with a magnitude and phase error at said frequency of 1 GHz, when referenced to a signal at said input INP, of no more than 0.015 dB (10 dB=1 Bell) and 0.15 degrees, respectively.

2. The circuit of claim 1, wherein said bias input IBIAS is the input to a current source for providing current to first and second current mirrors.

3. The circuit of claim 2, wherein said first mirror is connected between the junction of the sources of said first and said second MOS transistors and said reference potential.

4. The circuit of claim 1, wherein said capacitive means $C_D$ splits the input voltage at said input INP equally across the gate-source of said first and said second MOS transistor.

5. The circuit of claim 1, wherein said second stage is further comprised of a second current mirror connected between the junction of the sources of said third and said fourth MOS transistors and said reference potential.

6. The circuit of claim 1, wherein said second stage is further comprised of a first capacitive means $C_{F1}$ and a second capacitive means $C_{F2}$, where said capacitive means $C_{F1}$ and $C_{F2}$ are connected between the drain of said third and said fourth MOS transistors and the gate of said fourth and said third MOS transistor, respectively.

7. The circuit of claim 6, wherein said first and said second capacitive means $C_{F1}$ and $C_{F2}$, where said capacitive means $C_{F1}$ and $C_{F2}$ each have a capacitance 5 to 10 times larger than the parasitic gate-to-drain capacitance of said third and said fourth MOS transistor, respectively.

8. A circuit for converting a single-ended input signal to a differential output signal, comprising:

a voltage supply;

a reference potential;

a first stage, having an input INP with signal $v_i$ and a bias input IBIAS with signal ibias, first and second output nodes N1 and N2 with signals $v_{i1}$ and $v_{i2}$, respectively, said first stage providing a differential output signal at said nodes N1 and N2, said first stage having a first and a second MOS transistor of a first conductivity-type forming a differential amplifier, a first and a second resistive means connected between said voltage supply and the drain of said first and said second MOS transistor, respectively, the gate of said first MOS transistor coupled to said input INP via capacitive means $C_{I1}$, and where a capacitive means $C_D$ connected across said gate and the source of said first MOS transistor compensates for a parasitic drain to reference potential capacitance $C_B$ of a tail current source, where said first stage further comprises:

a current source having an input and a first and a second output, said input of said current source coupled to said bias input IBIAS for biasing said current source, said current source comprised of MOS transistors of a second conductivity-type;

a first and a second current mirror, with a first and a second input each, said first and said second input of said current mirrors connected to said first and said second output of said current source, respectively, said first and said second current mirror comprised of MOS transistors of a said first conductivity-type;

the drains of said first and said second MOS transistor coupled to said voltage supply via said first and said second resistive means, respectively; the drains of said first and said second MOS transistors labeled nodes N1 and N2, respectively;

the sources of said first and said second MOS transistor joined in node T1 and coupled via said first current mirror to said reference potential;

a fifth resistive means in series with said second current mirror coupled between said voltage supply and said reference potential;

the gate of said first and said second MOS transistor coupled via a sixth and a seventh resistive means, respectively, to the junction between said fifth resistive means and said second current mirror; and the gate of said second MOS transistor coupled via capacitive means $C_{f2}$ to said reference potential;

a second stage connected to said nodes N1 and N2, said second stage having outputs OUTA and OUTB, said second stage having a third and a fourth MOS transistor of said first conductivity-type forming a differential amplifier, a first capacitive means $C_{F1}$ connected between the drain of said third MOS transistor and the gate of said fourth MOS transistor, a second capacitive means $C_{F2}$ connected between the drain of said fourth MOS transistor and the gate of said third MOS transistor, said first and said second capacitive means $C_{F1}$ and $C_{F2}$ each having a capacitance 5 to 10 times larger than the parasitic gate-to-drain capacitance of said third and said fourth MOS transistor, respectively, said first and second capacitive means $C_{F1}$ and $C_{F2}$ contributing toward a frequency response of signals $v_{o1}$ and $v_{o2}$ at said outputs OUTA and OUTB, ranging in frequency from 100 kHz to 1 GHz (1 GHz=$10^9$ Hertz), with a magnitude and phase error at said frequency of 1 GHz of no more than 0.015 dB (10 dB=1 Bell) and 0.15 degrees, respectively, when referenced to said signal $v_i$ at said input INP; and said first and said second stage connected between said voltage supply and said reference potential.

9. The circuit of claim 8, wherein said first and second current mirrors are cascoded current mirrors.

10. The circuit of claim 8, wherein said second stage further comprises:

a current source having an input and a first and a second output, said input of said current source coupled to said bias input IBIAS for biasing said current source, said current source comprised of MOS transistors of a second conductivity-type;

a current mirror, with a first and a second input, said first and said second input of said current mirror connected to said first and said second output of said current source, respectively, said current mirror comprised of MOS transistors of a said first conductivity-type;

the drains of said third and said fourth MOS transistor coupled to said voltage supply via said third and said fourth resistive means, respectively; the drains of said third and said fourth MOS transistors representing outputs OUTA and OUTB, respectively;

the sources of said third and said fourth MOS transistor joined in node T2 and coupled via said to said reference potential; and the gate of said third and said fourth MOS transistor connected to said node N1 and N2, respectively.

11. The circuit of claim 10, wherein said current mirror is a cascoded current mirror.

12. The circuit of claim 8, wherein the magnitude of gain at said outputs OUTA and OUTB ranges from 7 to 9 dB (10 dB=1 Bell) at a frequency of 100 kHz (1 kHz=1000 Hertz).

13. The circuit of claim 8, wherein the magnitude of gain at said outputs OUTA and OUTB ranges from 6 to 8 dB at a frequency of 1 GHz (1 GHz=109 Hertz).

14. The circuit of claim 8, wherein the phase of gain at said output OUTA is less than 0.09 degrees at a frequency of 100 kHz (1 kHz=1000 Hertz).

15. The circuit of claim 8, wherein the phase of gain at said output OUTA is less than −72 degrees at a frequency of 1 GHz (1 GHz=109 Hertz).

16. The circuit of claim 8, wherein the phase of gain at said output OUTB is at least −179 degrees at a frequency of 100 kHz (1 kHz=1000 Hertz).

17. The circuit of claim 8, wherein the phase of gain at said output OUTB is at least 108 degrees at a frequency of 1 GHz (1 GHz=$10^9$ Hertz).

18. The circuit of claim 8, wherein said capacitive means $C_D$ splits the input voltage at said input INP equally across the gate-source of said first and said second MOS transistor.

19. A method of converting a single-ended input signal to a differential output signal, comprising:

providing a differential input stage, having a signal input INP and differential output signals;

providing differential amplification in said differential input stage with a first and a second MOS transistor, where said first MOS transistor receives said signal input INP;

compensating a parasitic tail current source transistor capacitance of said differential input stage with capacitive means $C_D$ connected across the gate and a source of said first MOS transistor thereby splitting the input signal voltage equally across the gate-source of said first and said second MOS transistor;

connecting a differential output stage to said differential output signals of said input stage;

providing said differential amplification of said differential output stage with a third and a fourth MOS transistor;

coupling compensating capacitive means between the gates of one of said transistors of said differential output stage with the drains of the other transistor of said output stage;

making the capacitance of said compensating capacitive means from 5 to 10 times larger than the parasitic capacitance from gate-source of said transistors of said differential output stage to compensate for negative feedback effects;

making the transconductance of said transistors of said differential output stage larger by a factor ranging from 40 to 100 than the output conductance of the tail current source transistor of said differential output stage; and providing fully differential output signals at the output of said differential output stage ranging in frequency from 100 kHz to 1 GHz (1 GHz=$10^9$ Hertz), with a magnitude and phase error at said frequency of 1 GHz of no more than 0.015 dB (10 dB=1 Bell) and 0.15 degrees, respectively, when referenced to an signal at said input INP.

* * * * *